US007267559B2

(12) United States Patent
Hashitani et al.

(10) Patent No.: US 7,267,559 B2
(45) Date of Patent: Sep. 11, 2007

(54) ANISOTROPIC CONDUCTIVE SHEET, PRODUCTION PROCESS, CONTACT STRUCTURE, ELECTRONIC DEVICE AND INSPECTION APPARATUS FOR OPERATION TEST

(75) Inventors: Takafumi Hashitani, Kawasaki (JP); Shigeyuki Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/141,778

(22) Filed: May 10, 2002

(65) Prior Publication Data

US 2002/0191406 A1    Dec. 19, 2002

(30) Foreign Application Priority Data

May 10, 2001  (JP)  ............................. 2001-140497

(51) Int. Cl.
*H01R 4/58* (2006.01)
(52) U.S. Cl. ....................................................... 439/91
(58) Field of Classification Search ................. 439/91, 439/66, 591
See application file for complete search history.

(56) References Cited

U.S. PATENT DOCUMENTS

| 6,168,442 | B1 * | 1/2001 | Naoi ............................. 439/91 |
| 6,183,272 | B1 * | 2/2001 | Muller et al. ................... 439/91 |
| 6,296,493 | B1 * | 10/2001 | Michiya ....................... 439/66 |
| 6,394,821 | B1 * | 5/2002 | Matsumura et al. ........... 439/91 |
| 6,422,879 | B2 * | 7/2002 | Fujimura ....................... 439/91 |
| 6,438,831 | B1 * | 8/2002 | Hagihara ....................... 29/884 |

FOREIGN PATENT DOCUMENTS

| JP | 51-93393 | 8/1976 |
| JP | 53-147772 | 12/1978 |
| JP | 61-118977 | 6/1986 |
| JP | 61-250906 | 11/1986 |
| JP | 5-50365 | 7/1993 |
| JP | 5-59756 | 8/1993 |
| JP | 6-60930 | 3/1994 |
| JP | 6-76909 | 3/1994 |
| JP | 6-89752 | 3/1994 |
| JP | 7-161400 | 6/1995 |
| JP | 8-240635 | 9/1996 |
| JP | 8-273441 | 10/1996 |
| JP | 2000-11766 | 1/2000 |
| JP | 2000-164270 | 6/2000 |
| JP | 2000-135877 | 8/2000 |
| JP | 2001-052780 | 2/2001 |

* cited by examiner

*Primary Examiner*—Gary F. Paumen
(74) *Attorney, Agent, or Firm*—Staas & Halsey LLP

(57) ABSTRACT

An anisotropic conductive sheet comprising an insulating base material and a plurality of conductive passages embedded at predetermined positions in the insulating base material, penetrating the insulating base material in the thickness direction. The conductive passage comprises a matrix consisting of non-silicone material or silicone material having rubber elasticity, the matrix material being filled into through-holes formed at a predetermined position in the base material and then hardened, and a conductive filler dispersed in the matrix at an amount capable of exhibiting conductivity at all times. A surface layer of conductive material is capable of functioning as a contact and ensuring an electrical connection by piercing a surface layer of an opponent when the surface layer is used as a contact, such as a layer of fine conductive particles is further provided on at least one of the end faces of the conductive passage. An anisotropic conductive sheet of the present invention can be advantageously used in an electronic device or inspection apparatus, used for an operation test, as a contactor.

20 Claims, 9 Drawing Sheets

Fig.10
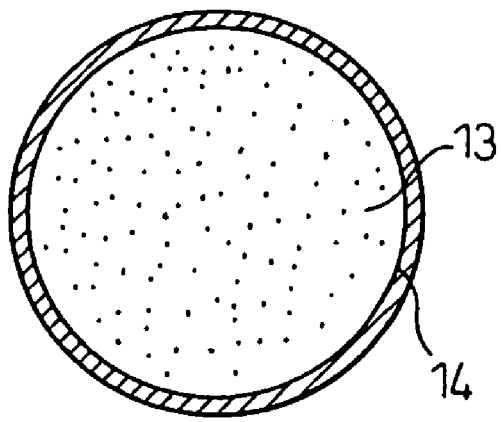
Fig.11A  Fig.11B
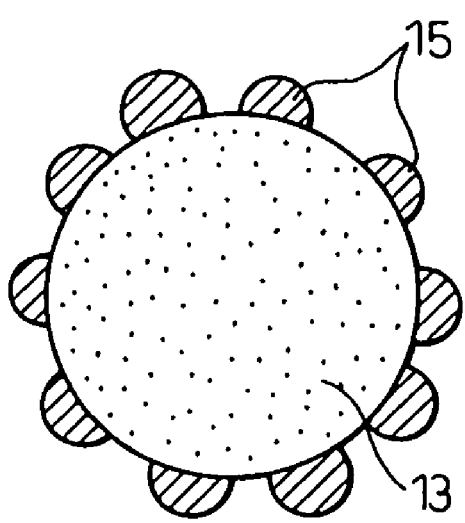 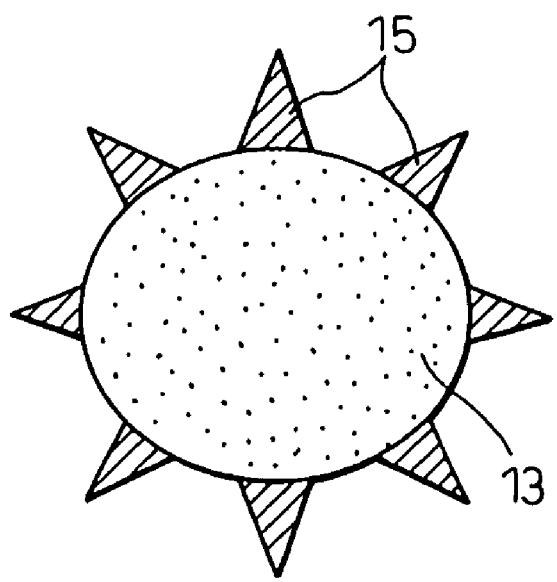

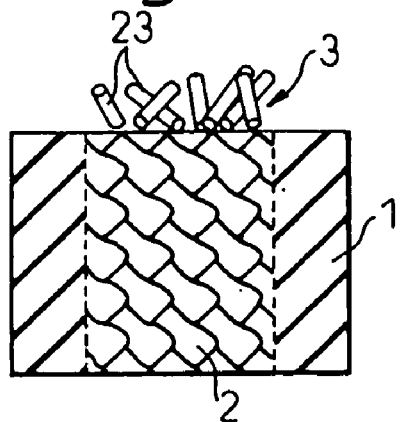
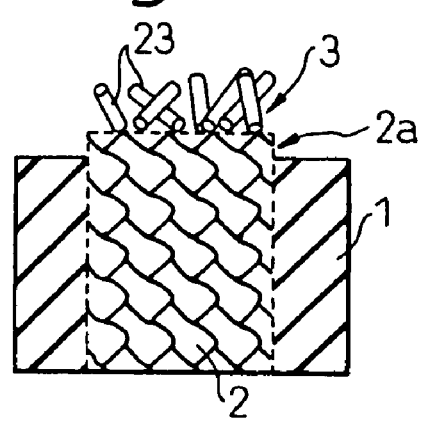
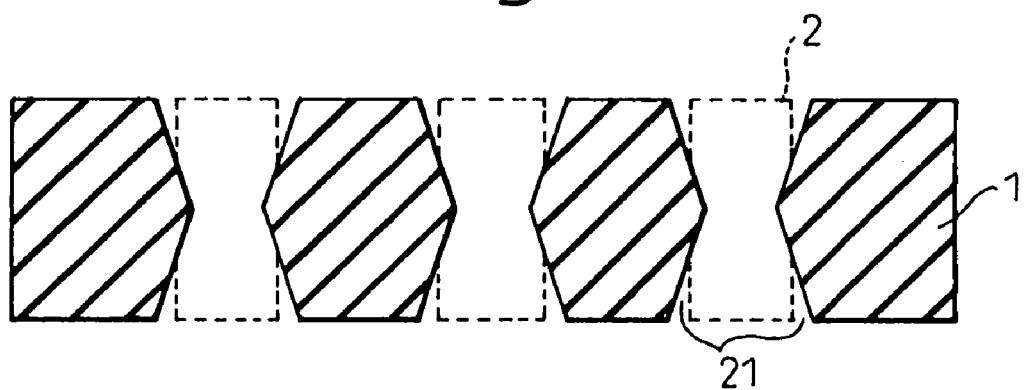
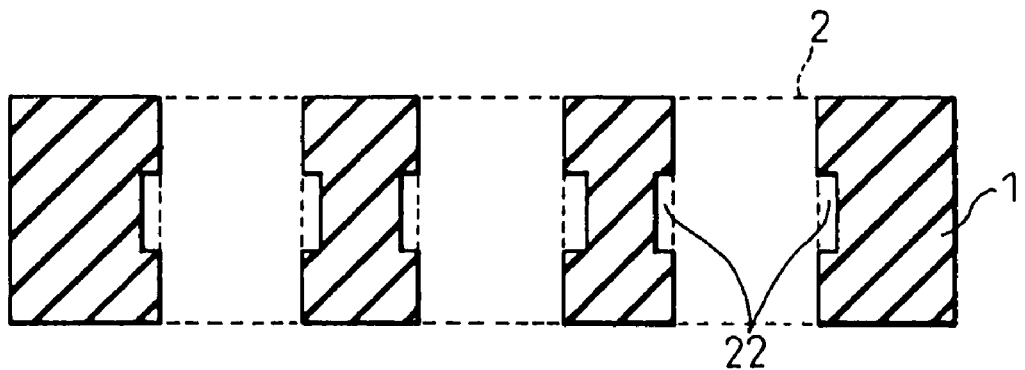

ANISOTROPIC CONDUCTIVE SHEET, PRODUCTION PROCESS, CONTACT STRUCTURE, ELECTRONIC DEVICE AND INSPECTION APPARATUS FOR OPERATION TEST

CROSS-REFERENCE TO RELATED PATENT APPLICATIONS

This patent application is based on Japanese Patent Application No. 2001-140497 filed on May 10, 2001, and claims the priority of this patent application, the contents being incorporated herein by reference.

BACKGROUND OF THE INVENTION

1. Field of the Invention

The present invention relates to a contact structure. More particularly, the present invention relates to a contact structure used for the electrical connection of electronic parts represented by LSI, in other words, a contactor. Especially, the present invention relates to an anisotropic conductive sheet used as a contactor in the electrical connection between circuit devices such as electronic parts or used as a contactor in the inspection apparatus used for inspecting the operation of circuit devices such as a printed circuit board and semiconductor integrated circuit. The present invention also relates to an electronic device and inspection apparatus for operation test into which the above conductive sheet is incorporated. Note in this specification that the term "LSI" is frequently used, and as long as a specific notice is not given, the term "LSI" means, of course, various electronic parts represented by LSI and VLSI, and further means other parts and elements useful in the practice of the present invention.

2. Description of the Related Art

Recently, the technology of producing semiconductor substrate and others has been remarkably developed, and according to the development of the production technology, the pattern of LSI wiring has been made remarkably fine and, further, the number of LSI terminals has been remarkably increased and, furthermore, the terminals have been made remarkably fine. Concerning the form of using LSI, there is a strong demand of downsizing and packaging the parts at high density. This will be easily understood from the fact that portable apparatuses, the size of which must be small and the performance of which must be high, for example, cellular phones, PHS phones, mobile personal computers, cameras integrated with a videorecorder and electronic computers of high performance, in which a distance between LSIs adjacent to each other is minimized so as to ensure operation at high speed, are widely spread and put on the market.

The form of delivery of LSI is changing according to the recent tendency described above. That is, attention is paid to the method of delivery of LSIs in which LSIs are delivered not being packaged, that is, LSIs are delivered in the form of LSI chips, and further, LSIs are delivered after the performance of LSIs have been guaranteed so that the performance of LSIs, which are not packaged, is the same as that of packaged LSIs. Actually, there is an increasing demand of the delivery of LSIs in which LSIs are delivered as KGD (Known Good Die) or LSIs are delivered as CSP (Chip Size Package) which is a small package, the size of which is the same as that of the LSI chip.

Due to the above circumstances, it is indispensable to provide a contact structure (contactor) capable of positively coming into contact with fine terminals of multiple pin structure which are arranged in LSI so that the operation and quality of an LSI can be tested.

Further, from the viewpoint of enhancing the efficiency of an LSI test, there is a strong demand of the test (FT: Final Test or BI: Burn In) in which LSI is not separated into individual chips but LSI is kept in the form of a wafer and all LSIs are simultaneously tested all at once. When all LSIs are simultaneously tested all at once, for example, the following effects can be expected.

1. Handling efficiency can be enhanced.

When chip sizes are different from each other, the handling device cannot be used for general purpose. However, when wafers are handled, all wafers can be simultaneously conveyed all at once because the sizes of the wafers are standardized.

2. Information of defective product can be managed by a wafer map.

In addition to that, according to wafer level CSP, which has been recently developed and disclosed, all processes from the wafer process to the final assembling process (packaging process) can be executed in the form of the wafer. If it becomes possible to conduct testing in the form of the wafer, the efficiency of the process can be more enhanced.

However, as described above, the terminals of each LSI has become fine and the number of the terminals of each LSI has been increased. Therefore, it is very difficult to realize a contactor capable of simultaneously coming into contact with a plurality of terminals of LSI which is kept in the state of a wafer and, if possible, a contactor capable of simultaneously coming into contact with all terminals of LSI on a wafer all at once. Realization of such a contactor has become a common problem to be solved in the industry.

As a contactor capable of solving the above problems, for example, there have already been proposed a needle type mechanical probe and a membrane type probe. However, the above probes are disadvantageous as follows. The costs of both the needle type mechanical probe and membrane type probe are high. Further, in the former needle type mechanical probe, as the individual pins are obliquely arranged, the arrangement and positional accuracy of needle ends are limited. In the latter membrane type probe, the contact electrodes cannot be freely moved.

Thus, in order to solve the above problems, an anisotropic conductive rubber sheet was devised. As a base material of this anisotropic conductive rubber sheet, rubber is used, and electric conductive material such as metallic particles or metallic wires is incorporated into the rubber only in the thickness direction. For example, Japanese Unexamined Patent Publication (Kokai) No. 51-93393 discloses a method of producing an elastic contact sheet (a dispersion type anisotropic conductive elastomer sheet) characterized in that conductive metallic particles are aligned in one direction and dispersed in an flexible insulating material (elastomer). Further, Japanese Unexamined Patent Publication (Kokai) No. 53-147772 discloses a method of producing a conductive elastomer (an uneven-distribution type anisotropic conductive elastomer sheet) capable of exhibiting conductivity upon pressurization including a large number of conductive passage forming sections extending in the thickness direction and also including an insulating section to insulate the large number of conductive passage forming sections from each other when conductive magnetic particles are unevenly distributed in a high polymer elastic body. Furthermore, Japanese Unexamined Patent Publication (Kokai) No. 61-250906 discloses an example in which the uneven-distribution type anisotropic conductive elastomer sheet is improved. This improved example is characterized in that a step portion is formed between the surface of the electric conductive passage forming section and that of the insulating section.

According to the latest examples, Japanese Unexamined Patent Publication (Kokai) No. 2000-11766 discloses an anisotropic conductive sheet which is schematically shown in FIG. 1. The anisotropic conductive sheet shown in FIG. 1 is characterized in that the electrical continuity section 52 containing conductive particles 53 in the insulating material is formed and that the insulating portion 55 except for the electrical continuity section 52 is made of an elastic insulating body and that the insulating portion 55 contains insulating particles 54.

However, these and other anisotropic conductive elastomer sheets of the prior art still leave room for improvements. For example, the above anisotropic conductive elastomer sheets of the prior art have the following problems.

(a) The life span is short.

Especially when the anisotropic conductive elastomer sheets are used at high temperatures, the rubber section is plastically deformed. Therefore, the above anisotropic conductive elastomer sheets of the prior art can be used only once or several tens of times. For example, in the case of a BI Test, high temperatures not lower than 125° C. are applied. Therefore, the above problems become remarkable.

(b) It is impossible to cope with a small pitch.

It is difficult to incorporate conductive material into the anisotropic conductive sheet. Therefore, the pitch between the electrical continuity sections is usually about 500 μm. The pitch between the electrical continuity sections is about 200 to 150 μm at the most preferred instances.

(c) It is impossible to accomplish a predetermined electrical connection.

In general, a surface electrode of the semiconductor integrated circuit is made of aluminum, the mechanical strength of which is low. Therefore, in order to enhance the mechanical strength of the surface electrode, an oxide film of aluminum is formed on the surface. As the mechanical strength of this oxide film of aluminum is high, when the sheet is connected with an electrode, it is difficult for the electrical conductive passage section of the sheet to pierce the oxide film of aluminum. As a result, it is impossible to attain a predetermined electrical connection. Especially when the sheet is connected with the electrodes all at once, although the sheet can be partially connected with the electrodes, it is impossible to connect the sheet with all the electrodes uniformly and stably.

(d) Circuit apparatus and others are polluted.

In general, silicone rubber is used as the elastic high polymer material composing the anisotropic conductive elastomer sheet. However, since this silicone rubber contains silicone oil of low molecular weight, for example, when the elastomer sheet is used for the inspection of a circuit device over a long period of time, silicone oil bleeds out onto the sheet surface. By this silicone oil bleeding out onto the sheet surface, a surface of the electrode to be inspected, which is an object of inspection, is polluted. As a result, when the circuit device is mounted, it becomes impossible to conduct bonding and further it becomes impossible to attain a predetermined electrical connection.

Some trials have been made to solve the above problems. For example, as shown in FIG. 2, Japanese Unexamined Patent Publication (Kokai) No. 2000-235877 discloses an uneven-distribution type anisotropic conductive sheet 60 having a base material of the sheet in which a plurality of elastic conductive passage forming sections 62 respectively extending in the thickness direction are arranged being insulated from each other by the insulating section 64. This anisotropic conductive sheet 60 is characterized as follows. On the anisotropic conductive sheet 60, on the electrical conductive passage forming section 62 which has been formed by the orientation treatment of electric conductive fine particles, the conductive material 66 used for the contact made of a metallic sheet or metallic film is integrally arranged via the conductive adhesion layer 65 in which conductive powder is dispersed in hardening resin. However, the following problems may be encountered in the case of the above anisotropic conductive sheet 60. The conductive material 66 used for the contact is made of hard material such as a metallic sheet or metallic film. Further, the base material of the conductive material 66 used for the contact is hard and not elastic. Therefore, it is impossible to successfully pierce an aluminum oxide film of which is a protective film for protecting the electrode surface. Further, the production process is complicated in such a manner that hardening treatment must be conducted under the condition of a parallel magnetic field, which causes an increase in the production cost.

SUMMARY OF THE INVENTION

An object of the present invention is to solve the above problems, thereby providing an anisotropic conductive sheet characterized in that: the life span is long; it is possible to cope with a small pitch; a predetermined electrical connection can be attained; the circuit devices are not polluted; the production process is simple; and the production cost is low.

Another object of the present invention is to provide an anisotropic conductive sheet showing no bleeding out of silicone oil.

Still another object of the present invention is to provide a contactor capable of simultaneously contacting with terminals of all LSIs on a wafer, while wafer is as produced and thus not fabricated.

Still another object of the present invention is to provide a method of easily producing the above anisotropic conductive sheet and contactor by a simple producing process at low cost.

Still another object of the present invention is to provide an electronic device on which the anisotropic conductive sheet of the present invention is mounted.

In addition to the above objects, it is an object of the present invention to provide an inspection apparatus for evaluating quality of the anisotropic conductive sheet of the present invention when the anisotropic conductive sheet is incorporated into the inspection apparatus and an operation test is made.

The above objects and other objects of the present invention will be easily understood from the following detailed descriptions.

In one aspect of the present invention, there is provided an anisotropic conductive sheet comprising an insulating base material and a plurality of conductive passages embedded at predetermined positions in the insulating base material, and penetrate the insulating base material in the thickness direction, wherein the conductive passage comprises a matrix consisting of non-silicone material having rubber elasticity, the non-silicone material being filled into through-holes formed at a predetermined position in the base material and then hardened, and a conductive filler dispersed in the matrix at an amount or quantity capable of exhibiting conductivity at all times.

The present invention also provides a method of producing the above anisotropic conductive sheet and articles using the above anisotropic conductive sheet.

In another aspect of the present invention, there is provided a method of producing an anisotropic conductive sheet comprising an insulating base material and a plurality of conductive passages embedded in the insulating base material at predetermined positions, and penetrate the insulating base material in the thickness direction, in which the method comprises the steps of: forming through-holes at positions corresponding to the conductive passages in the insulating base material; and charging into the through-holes a conductive passage-forming material, which comprises a matrix material consisting of non-silicone material and a conductive filler dispersed in the matrix material; and hardening the charged conductive passage-forming material to form the conductive passage exhibiting conductivity at all times.

In still another aspect of the present invention, there is provided a contact structure in which a plurality of conductive passages are embedded in an insulating base material, and penetrate the insulating base material in the thickness direction, wherein the conductive passage comprises a matrix consisting of non-silicone material having a predetermined rubber elasticity, the non-silicone material being filled into through-holes formed at a predetermined position in the base material and then hardened, and a conductive filler dispersed in the matrix at an amount capable of exhibiting conductivity at all times, and the conductive passage can be freely extended and contracted in the thickness direction of the base material.

In still another aspect of the present invention, there is provided an electronic apparatus in which a plurality of circuit devices are stacked on each other and the circuit devices are electrically connected with each other via an anisotropic conductive sheet of the present invention comprising an insulating base material and a plurality of conductive passages embedded in the base material, piercing in the thickness direction.

In still another aspect of the present invention, there is provided an inspection apparatus for an operation test used for testing an operation of a circuit device, comprising an anisotropic conductive sheet of the present invention comprising an insulating base material and a plurality of conductive passages embedded at predetermined positions in the insulating base material, penetrating the insulating base material in the thickness direction, wherein one end face of the conductive passage of the anisotropic conductive sheet is connected with terminals of the circuit device, and the other end face of the conductive passage of the anisotropic conductive sheet is connected with a circuit board and a contacting body to be mounted on the circuit board.

Further, another aspect of the present invention, there is provided an anisotropic conductive sheet comprising an insulating base material and a plurality of conductive passages embedded at predetermined positions in the insulating base material and penetrate the insulating base material in the thickness direction, wherein the length of the conductive passage is identical with the thickness of the base material, the conductive passage comprises a matrix consisting of silicone material having rubber elasticity, the silicone material being filled into through-holes formed at a predetermined position in the base material and then hardened, and a conductive filler dispersed in the matrix at an amount capable of exhibiting conductivity at all times.

In still another aspect of the present invention, there is provided a method of producing an anisotropic conductive sheet comprising an insulating base material and a plurality of conductive passages embedded at predetermined positions in the insulating base material and penetrate the insulating base material in the thickness direction, in which the method comprises the steps of: forming through-holes at positions corresponding to the conductive passages in the insulating base material; and charging into the through-holes a conductive passage-forming material, which comprises a matrix material consisting of silicone material and a conductive filler dispersed in the matrix material so that an end face of the conductive passage forming material can be substantially identical with a surface of the matrix; and hardening the charged conductive passage-forming material to form the conductive passage exhibiting conductivity at all times.

In still another aspect of the present invention, there is provided a contact structure in which a plurality of conductive passages are embedded in an insulating base material and penetrate the insulating base material in the thickness direction, wherein the length of the conductive passage is identical with the thickness of the base material, the conductive passage comprises a matrix consisting of silicone material having rubber elasticity, the silicone material being filled into through-holes in the base material and then hardened, and a conductive filler dispersed in the matrix at an amount capable of exhibiting conductivity at all times, and the conductive passage can be freely extended and contracted in the thickness direction of the base material.

In still another aspect of the present invention, there is provided an electronic apparatus in which a plurality of circuit devices are stacked on each other, the circuit devices are electrically connected with each other via an anisotropic conductive sheet of the present invention comprising an insulating base material and a plurality of conductive passages embedded at predetermined positions in the base material, piercing in the thickness direction.

In still another aspect of the present invention, there is provided an inspection apparatus for an operation test used for testing an operation of a circuit device, which comprises an anisotropic conductive sheet of the present invention comprising an insulating base material and a plurality of conductive passages embedded at predetermined positions in the insulating base material, penetrating the insulating base material in the thickness direction, wherein one end face of the conductive passage of the anisotropic conductive sheet is connected with terminals and others of the circuit device, and the other end face of the conductive passage of the anisotropic conductive sheet is connected with a circuit board and a contacting body to be mounted on the circuit board.

Furthermore, in another aspect of the present invention, there is provided an anisotropic conductive sheet comprising an insulating base material and a plurality of conductive passages embedded at predetermined positions in the insulating base material, penetrating the insulating base material in the thickness direction, wherein the conductive passage comprises a matrix consisting of silicone material having rubber elasticity, the silicone material being filled into through-holes formed in the base material and then hardened, and a conductive filler dispersed in the matrix at an amount capable of exhibiting conductivity at all times, and the conductive sheet further comprises a conductive surface layer, which functions as a contact and ensures a sufficient electrical connection by piercing a surface layer of an opponent terminal when the conductive surface layer is used as a contact.

In still another aspect of the present invention, there is provided a method of producing an anisotropic conductive sheet comprising an insulating base material and a plurality of conductive passages embedded at predetermined positions in the insulating base material, and penetrate the insulating base material in the thickness direction, in which the method comprises the steps of: forming through-holes at positions corresponding to the conductive passages in the insulating base material; charging into the through-holes a conductive passage-forming material which comprises a matrix material consisting of silicone material and a conductive filler dispersed in the matrix material; hardening the charged conductive passage-forming material to form the conductive passage exhibiting conductivity at all times; and providing on at least one of the end faces of the conductive passage a conductive surface layer, which functions as a contact and ensures a sufficient electrical connection by piercing a surface layer of an opponent terminal when the conductive surface layer is used as a contact.

In still another aspect of the present invention, there is provided a contact structure in which a plurality of conductive passages are embedded in an insulating base material, and penetrate the insulating base material in the thickness direction, wherein the conductive passage comprises a matrix consisting of silicone material having rubber elasticity, the silicone material being filled into through-holes in the base material and then hardened, and a conductive filler dispersed in the matrix at an amount capable of exhibiting conductivity at all times, the conductive passage further comprises a conductive surface layer, which functions as a contact and ensures a sufficient electrical connection by piercing a surface layer of an opponent terminal when the conductive surface layer is used as a contact, on at least one of the end faces of the conductive passage, and the conductive passage can be freely extended and contracted in the thickness direction of the base material.

In still another aspect of the present invention, there is provided an electronic apparatus in which a plurality of circuit devices are stacked on each other, the circuit devices are electrically connected with each other via an anisotropic conductive sheet of the present invention comprising an insulating base material and a plurality of conductive passages embedded at predetermined positions in the base material, piercing in the thickness direction.

In still another aspect of the present invention, there is provided an inspection apparatus for an operation test used for testing an operation of a circuit device, which comprises an anisotropic conductive sheet of the present invention comprising an insulating base material and a plurality of conductive passages embedded at predetermined positions in the insulating base material, penetrating the insulating base material in the thickness direction, wherein one end face of the conductive passage of the anisotropic conductive sheet is connected with terminals of the circuit device, and the other end face of the conductive passage of the anisotropic conductive sheet is connected with a circuit board and a contacting body to be mounted on the circuit board.

In the anisotropic conductive sheet of the present invention, it is usually possible for the conductive passage to exhibit a predetermined level of conductivity without applying pressure onto the anisotropic conductive sheet. That is, the conductive passage can exhibit a necessary level of conductivity, of course, when pressure is applied to the conductive passage, and even when no pressure is applied to the conductive passage, and accordingly the conductive passage can be described herein that it has an "usually provided or pressure-independent conductivity". That is, the conductive passage can exhibit conductivity at all times. As can be easily understood, from the viewpoints of the function and structure, the anisotropic conductive sheet of the present invention having a pressure-independent conductivity can be distinguished from a conventional conductive sheet exhibiting conductivity upon application of pressure or having pressure-sensitive conductivity.

The conductive passage having pressure-sensitive conductivity is composed of a matrix and a conductive filler dispersed in the matrix, and some matrix may consist of non-silicone material, and some matrix may consist silicone material.

The structure of the anisotropic conductive sheet of the present invention may change due to the structural material of the matrix mainly composing the conductive passage. However, basically, any conductive sheet has the same characteristics which are common to the present invention and can be proposed by the similar methods. In the following detailed explanations of the conductive sheet, the overlapping portions are omitted here to avoid duplication, accordingly.

BRIEF DESCRIPTION OF THE DRAWINGS

FIG. 10 is a sectional view schematically showing a preferred embodiment of fine conductive powder used for forming a contact of a conductive sheet of the present invention;

FIGS. 11A and 11B are respectively sectional views schematically showing another preferred embodiment of fine conductive powder used for forming a contact of a conductive sheet of the present invention;

FIGS. 12A and 12B are respectively sectional views schematically showing still another preferred embodiment of a portion around a conductive passage of a conductive sheet of the present invention;

FIG. 13 is a sectional view schematically showing another embodiment of an insulating base material used for a conductive sheet of the present invention;

FIG. 14 is a sectional view schematically showing still another embodiment of an insulating base material used for a conductive sheet of the present invention;

DESCRIPTION OF THE PREFERRED EMBODIMENTS

As is explained in detail below, by referring to the accompanying drawings, the present invention can be carried out in various embodiments within the scope of the claim of the present invention.

Figure 1:
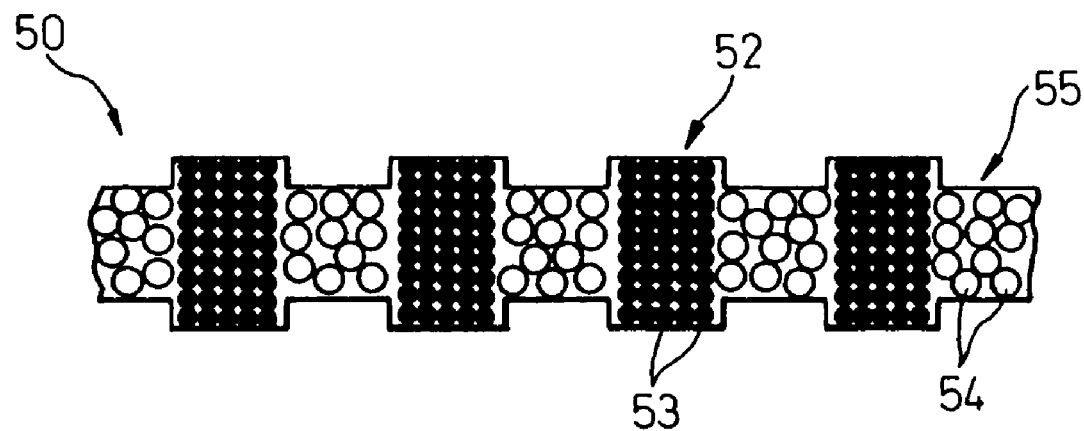
FIG. 1 is a sectional view schematically showing an example of a prior art anisotropic conductive sheet.
Figure 2:
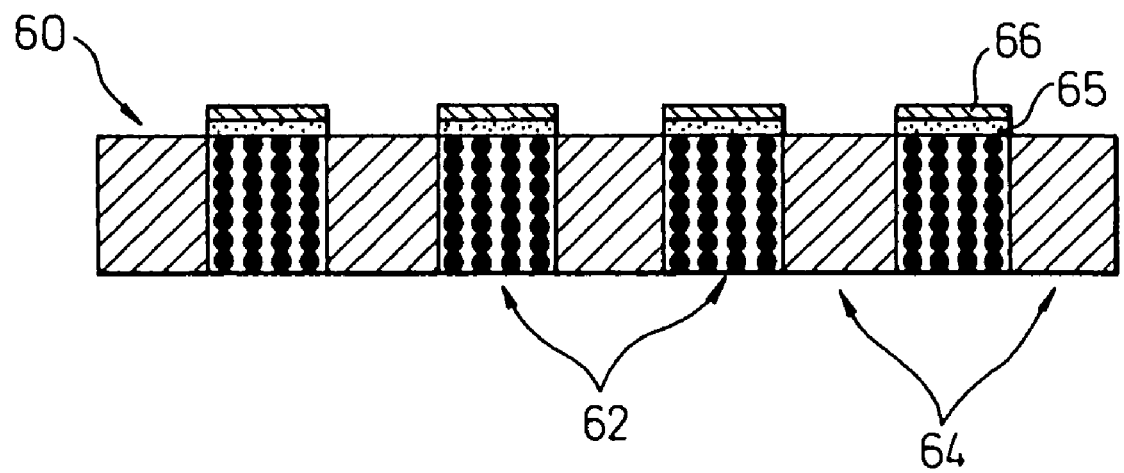
FIG. 2 is a sectional view schematically showing another example of a prior art anisotropic conductive sheet.
Figure 3:
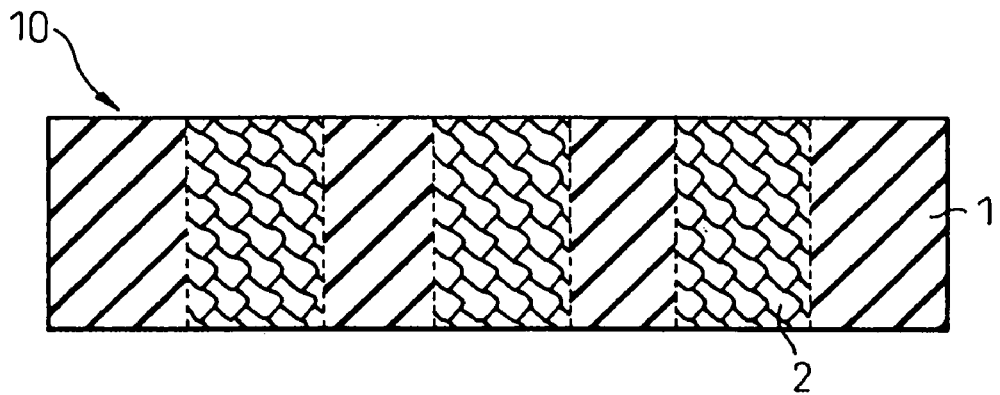
FIG. 3 is a sectional view schematically showing a preferred embodiment of a conductive sheet of the present invention.

FIG. 3 is a sectional view schematically showing a preferred embodiment of an anisotropic conductive sheet of the present invention. The anisotropic conductive sheet 10 is composed of an insulating base material 1 and a plurality of conductive passages 2 which are formed at predetermined positions of the base material 1. As shown in the drawing, the conductive passage 2 is embedded in the sheet-shaped base material 1, piercing the sheet-shaped base material 1 in the thickness direction. The present invention is characterized in that the elastic material composing the conductive passage 2 is a conductive elastic material capable of exhibiting a sufficiently high level of rubber elasticity after the conductive elastic material has been hardened. In this connection, in the present invention, a portion of this anisotropic conductive sheet 10 around the conductive passage 2 can be referred to as a contact structure or a contactor which includes the conductive passage 2.

In the anisotropic conductive sheet of the present invention, the insulating base material is not particularly limited to a specific embodiment. The insulating base material is preferably a sheet-shaped material formed by molding or laminating an insulating material. For example, the insulating base material may be made in such a manner that insulating material is formed into a sheet-shaped material of a predetermined thickness by means of rolling or calender forming. In the case where a relatively thin sheet-shaped material is used as a starting material, a necessary number of sheets are laminated so as to obtain a predetermined thickness and then integrated into one body by means of pressure or heating. When necessary, the sheet-shaped material may be formed by the combination of molding with lamination. Further, in the case of a ceramic sheet, it is possible to advantageously produce an objective sheet-shaped material by baking a green sheet. In order to enhance the insulating property of the above sheet-shaped material, the surface of the above sheet-shaped material may be covered with an insulating film. The thickness of the insulating base material can be changed in a wide range according to the use of the anisotropic conductive sheet, however, the thickness of the insulating base material is usually in the range from about 10 µm to 10 mm, and it is preferable that the thickness of the insulating base material is in the range from about 25 µm to 3 mm.

The insulating base material may be made of various insulating materials commonly used in the field of the anisotropic conductive sheet. Suitable insulating materials are enumerated as follows, although they are not limited to the following materials. Examples of the suitable insulating materials are: an insulating thermo-setting resin such as polyimide resin or fluororesin; an insulating thermo-plastic resin such as polyether ether ketone resin, polypropylene resin, polyester resin or vinyl resin; and an insulating ceramic material such as silicon. In the practice of the present invention, the most suitable insulating material can be appropriately selected from the above insulating materials by giving consideration to the insulating property, the working condition to be used, the contacting condition and the material price.

In the anisotropic conductive sheet of the present invention, the conductive passages are distributed in the base material so that the conductive passages can be insulated from each other by the base material. The conductive passages are not formed in such a manner that fine conductive particles dispersed in the insulating base material are oriented by the influence of a magnetic force like the conventional method, but the conductive passages are formed in such a manner that through-holes are formed at appropriate positions of the base material and filled with conductive passage-forming material and then hardened. Therefore, the conductive passages are embedded in the sheet-shaped base material, piercing the sheet-shaped base material, and the size and distribution pattern can be arbitrarily determined as long as the conductive passages can exhibit a predetermined level of elasticity and that of conductivity. That is, the size and distribution pattern of the conductive passages can be arbitrarily determined according to the detailed condition of the anisotropic conductive sheet. Especially, in the anisotropic conductive sheet of the present invention, it is one of the characteristics that the conductive passages can be formed at a small pitch of less than 150 µm, especially at a small pitch of less than 100 µm.

The conductive passages are formed from a conductive elastic material, especially a conductive elastic material capable of exhibiting a predetermined rubber elasticity when the anisotropic conductive sheet is completed. Conductive elastic material capable of being advantageously used for forming the conductive passage is a composite or compounded material comprising a base body (matrix) and a conductive filler dispersed in the matrix. The matrix material is not particularly limited to a specific material, however, it is preferable to use non-silicone material such as natural or synthetic rubber, urethane material or silicone material. In this matrix material, the conductive filler is dispersed in the amount which is sufficiently large so that the matrix material can exhibit conductivity at all times, i.e., pressure-independent conductivity. Therefore, it is possible to obtain a necessarily high conductivity even when the conductive passage is kept as it is or when the conductive passage is given stress in the case of an electrical connection and the like. Accordingly, a desired electrical connection can be surely and stably attained. Further, when the conductive passage is given stress, the stress can be suitably dispersed by the elasticity of rubber.

Matrix materials useful for forming the conductive passage can be roughly divided into two groups. In view of preventing silicone oil from bleeding out, it is possible to use rubber such as natural rubber, styrene butadiene rubber, nitrile butadiene rubber, ethylene propylene rubber, chloroprene rubber, hydrine rubber, acrylic rubber or urethane rubber. It is also possible to use a resin, an adhesive or another non-silicone matrix material. On the other hand, in the case where no problems of bleeding out of silicone oil are caused, and in the case where the problems can be solved by the structure of the conductive sheet, it is also possible to use matrix material of silicone such as silicone rubber in the same manner as that of the conventional method.

The filler dispersed in the matrix material preferably includes gold, silver, copper, nickel, aluminum, and their alloy, carbon and graphite. These materials can exhibit a high electrical conductivity and further they can be thoroughly mixed and dispersed in the matrix. Although the above fillers can be used in various forms, it is common to use them in the powder shape, bead-shape, flake-shape, needle-shape or branch-shape. Alternatively, the filler may be conductive composite fine particles composed of core particles and conductive metal covering surfaces of the core particles. In these composite fine particles, the core particles may be made of any of metal, ceramic and resin. The conductive metal covering the core particles may be gold, silver, copper, nickel, aluminum or their alloy. Of course, fillers may be used alone or may be used as a combination of two or more. Although an amount of the filler to be added can be changed in a wide range according to the desired effect of conductivity, it is generally in the range from about 40 to 95% by weight based on the entire amount of the matrix. Especially, it is preferable to add an amount of filler so that the fillers can be thoroughly contacted in the matrix. For example, in the case that a filler comprises resin particles covered with metal, an amount of the filler will not largely lower 40% by weight.

It is preferable that the matrix material and filler are thoroughly kneaded with each other so that they can be formed into a paste (of course, they may be formed into another form), and the matrix material and filler are charged into the through-holes, which have been previously formed at predetermined positions in the insulating base material, and then hardened, so that the conductive passages can be formed. Note that, when the conductive passages are formed in this way, if necessary, it is possible to add another component, for example, a binder. When minute spaces exist in the conductive passage as an auxiliary, the elasticity of the conductive passage can be enhanced. Therefore, a volatile organic component capable of forming minute spaces by decomposing and vaporizing when it is hardened, for example, wax may be added in a minute quantity.

In the anisotropic conductive sheet of the present invention, as shown in FIG. 3, the conductive passage may be composed in such a manner that the end face of the conductive passage is at the same level as the surface of the base material 1. Alternatively, the length of the conductive passage may be larger than the thickness of the base material, that is, at least one of the end faces of the conductive passage may be protruded outside from the surface of the base material. In the latter case, a protruding portion of the conductive passage will effectively function as a contact or other means.

Figure 4:
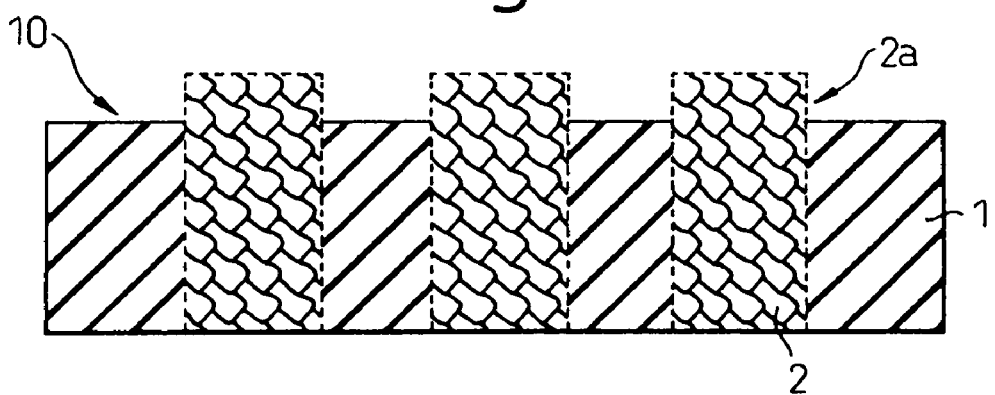
FIG. 4 is a sectional view schematically showing another preferred embodiment of a conductive sheet of the present invention.

FIG. 4 is a view showing an example in which one end face of the conductive passage 2 formed on the anisotropic conductive sheet 10 is protruded from the surface of the base material 1, so that the protruding portion 2a is composed. Note, although not shown in the drawing, the protruding portion 2a may be simultaneously formed on the opposite side of the base material. Alternatively, the protruding portions 2a may not be simultaneously formed on one side all at once, so that some protruding portions 2a may not be selectively formed.

In the anisotropic conductive sheet of the present invention, various improvements and changes may be made in the conductive passage within the scope of claim of the present invention.

In a preferred embodiment of the present invention, it is possible to provide a surface layer, which is made of conductive material suitable for forming a contact, on at least one end face of the conductive passage. This surface layer can function as a contact or a function relating to the contact. When this surface layer is used as a contact, it is possible for the contact to pierce a surface layer of an opponent terminal so as to ensure an electrical connection.

It is preferable that the above surface layer is composed of fine powder or fine particles. That is, "the surface layer" does not mean a metallic layer made by plating or a metallic sheet, but it means a layer on which conductive powder and particles are densely or roughly arranged, and it may be a single layer or multiple layer. When the surface layer made of the above conductive material is provided at an end portion of the conductive passage, an aluminum oxide film of a contact arranged in a body to be inspected can be easily pierced. As a result, a satisfactory electrical connection can be attained. In the conductive passage of the present invention, as an underlying material of the above hard surface layer, there is provided a base material made of a soft conductive material having rubber elasticity, that is, the conductive passage of the present invention adopts a hard and soft composite structure. Therefore, it is possible for the conductive passage of the present invention to provide a remarkable effect which cannot be obtained by the conventional hard underlying material. Even in the case of a large number of connecting portions in which the conductive section is contacted with terminals and other points, which is the latest tendency, the contacts can be satisfactorily and surely contacted with each other, and problems such as a defective contact are not caused.

Figure 5:
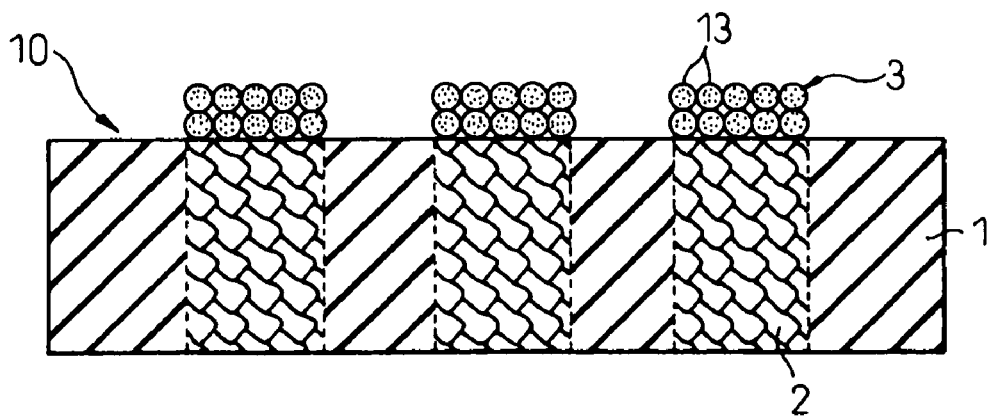
FIG. 5 is a sectional view schematically showing still another preferred embodiment of a conductive sheet of the present invention.
Figure 6:
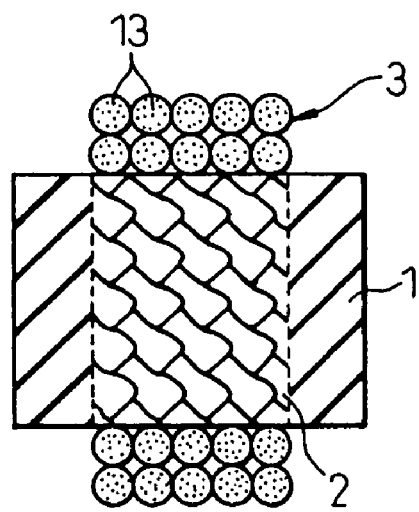
FIG. 6 is a sectional view schematically showing a preferred embodiment of a portion around a conductive passage of a conductive sheet of the present invention.
Figure 7A:
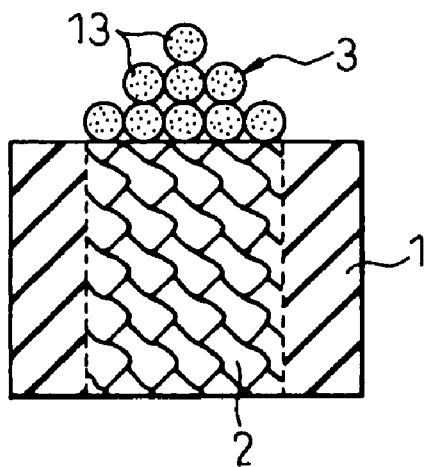
FIGS. 7A and 7B are respectively sectional views schematically showing another preferred embodiment of a portion around a conductive passage of a conductive sheet of the present invention.
Figure 7B:
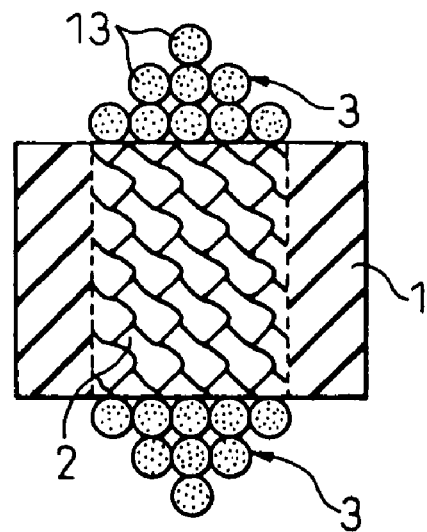
Figure 8A:
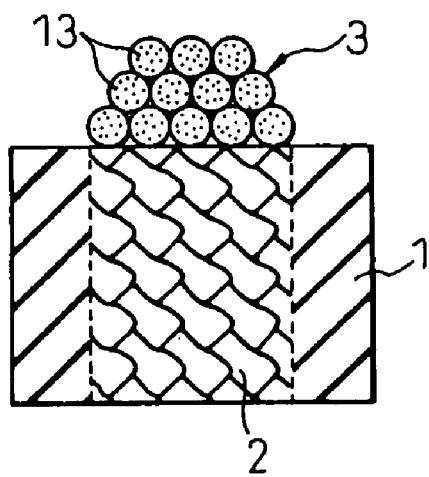
FIGS. 8A and 8B are respectively sectional views schematically showing still another preferred embodiment of a portion around a conductive passage of a conductive sheet of the present invention.
Figure 8B:
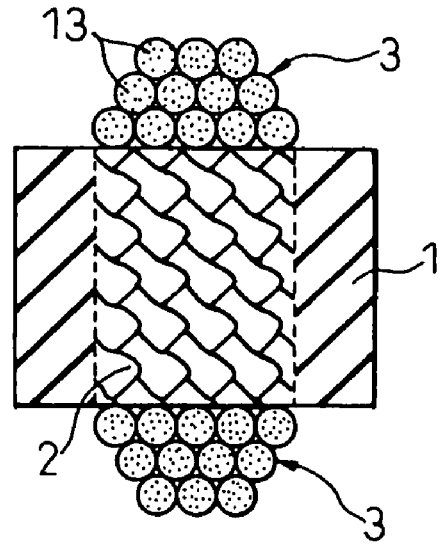
Figure 9A:
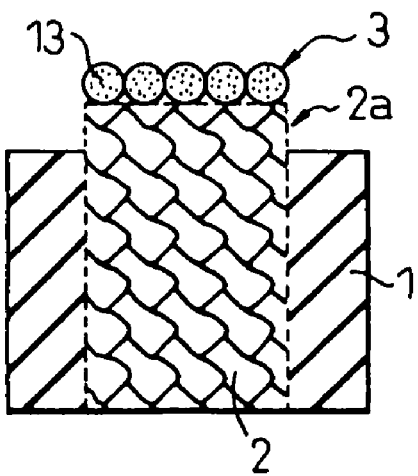
FIGS. 9A and 9B are respectively sectional views schematically showing still another preferred embodiment of a portion around a conductive passage of a conductive sheet of the present invention.
Figure 9B:
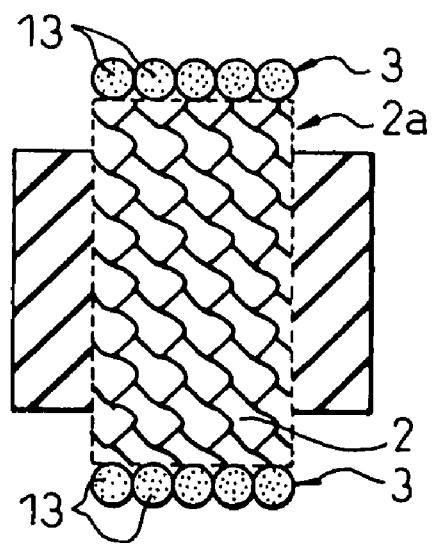

Although not limited to the structure shown in the drawing, in the case of the anisotropic conductive sheet shown in FIG. 3, the surface layer 3 made of the conductive material capable of forming a contact is provided on only one face of the base material so that it can be formed into the two layer structure. Then, the thus obtained structure is shown in FIG. 5. When the surface layer 3 made of the conductive material is provided on both faces of the base material 1, the thus obtained structure is shown in FIG. 6. Further, instead of the two layer structure, when the surface layer 3 made of the conductive material is formed into a pyramid structure, the thus obtained structure is shown in FIGS. 7A and 7B. FIG. 7A shows an example in which the surface layers are provided on one face, and FIG. 7B shows an example in which the surface layers are provided on both faces. Further, instead of the two layer structure of the surface layer 3 made of the conductive material, when the surface layers are formed into the three layer structure, the thus obtained structure is shown in FIGS. 8A and 8B. FIG. 8A is a view showing an example of a one-face arrangement, and FIG. 8B is a view showing an example of a both-face arrangement. Further, as shown in FIG. 4, it is possible to provide the surface layer 3 made of the conductive material on the anisotropic conductive sheet in the same manner. When the surface layer 3 made of the conductive material is provided only on one face of the base material 1 as a single layer structure, the thus obtained structure is shown in FIG. 9A. When the surface layer 3 made of the conductive material is provided on both faces of the base material 1, the thus obtained structure is shown in FIG. 9B. Note in these drawings that the respective surface layers made of the conductive material are composed of fine conductive powder 13, the detail of which will be explained hereinbelow.

In the anisotropic conductive sheet of the present invention, the surface layer made of the conductive material capable of forming a contact, which is formed on an end face of the conductive section when necessary, is preferably made of metal of high electrical conductivity such as gold, silver, copper, nickel, aluminum or their alloys. These metals or alloys may be used alone or alternatively, they may be used in a combination of two or more. Although these metals or alloys can be used in various forms, it is preferable to use them in the form of fine powder of a broken-piece-shape, bead-shape, rod-shape or lump-shape. In the example explained above referring to FIGS. 5 to 9B, bead-shaped fine powder 13 is used for the surface layer 3 made of the conductive material, and in the examples explained below referring to FIGS. 12A and 12B, rod-shaped fine powder 23 is used for forming the surface layer 3 made of the conductive material. Although the fine powder can be widely changed according to its forms and others, the length or diameter of particles of the fine powder is usually about 0.1 to 50 µm, preferably about 5 to 30 µm. Further, these fine powders may be applied or aligned as a single layer or multiple layers, or alternatively, they may be applied as an integrated aggregate of the powders.

In the anisotropic conductive sheet of the present invention, it is preferable that at least one portion of the surface of the fine powder is covered with a metallic thin film. Specifically, when the surface of the fine powder is covered with metal, the electrical conductivity of which is high, such as gold, silver, copper, nickel, aluminum or alloys of these metals, for example, by means of electroless plating, the effect of the electrical connection can be further exhibited. Further, in order to enhance the durability, it is preferable that the surface of the fine powder is plated with platinum, palladium or rhodium. FIG. 10 is a view showing this example. A surface of the fine powder 13 is covered with the thin metallic film 14. Although the thickness of the thin metallic film 14 can be changed in a wide range, the thickness of the thin metallic film 14 is generally in a range from about 0.01 to 20 µm, preferably from about 3 to 20 µm. Note that, in the case where the thin metallic film is additionally used as explained in this case, if necessary, the fine powder may not be made of conductive metal but the fine powder may be made of a conductive resin.

In the anisotropic conductive sheet of the present invention, from the viewpoint of further enhancing the electrical connection, it is preferable that the surfaces of the fine particles have very minute protrusions, the shapes of which are regular or irregular, under the condition that the thin metallic film exists or does not exist. The very minute protrusions are usually made of metal of high electrical conductivity such as gold, silver, copper, nickel, aluminum or alloys of these metals. These very minute protrusions can be made to adhere onto the surface of the fine powder by sputtering or vapor deposition. The form of the very minute protrusion is not particularly limited to a specific form. As long as the very minute protrusion can be stably attached to the fine powder, any form may be adopted. For example, hemispherical protrusions, conical protrusions, lump-shaped protrusions and combinations of these protrusions may be adopted. FIGS. 11A and 11B are views showing these examples. As shown in FIG. 11A, the hemispherical protrusions 15 are attached, and as shown in FIG. 11B, the conical protrusions 15 are attached. Although the size (the height from the surface of the minute protrusion 13) of the very minute protrusion 15 can be changed in a wide range, it is usually in a range from about 0.1 to 10 µm.

FIG. 12A is a view showing a method of improving an electrical connection of the conductive passage by densely providing the rod-shaped minute powder 23 on one end face of the conductive passage 2 formed on the anisotropic conductive sheet 10. Of course, when necessary, the above rod-shaped fine powder 23 may be densely provided on both sides of the conductive passage 2. FIG. 12B is a view showing an example in which one end face of the conductive passage 2 protrudes from the surface of the base material 1 so as to form the protruding section 2a and the rod-shaped fine powder 23 is densely provided on the end face.

In the anisotropic conductive sheet of the present invention, if necessary, various improvements and changes may be made to the shape of the conductive passage. For example, it is recommended that the shape of the through-holes formed in the base material is changed so that the shape of the conductive passage charged into the through-hole can be changed.

FIGS. 13 and 14 are views respectively showing an example in which the shape of the through-hole formed in the base material is changed. In the base material 1 shown in FIG. 13, since the size of the middle portion of the through-hole is reduced, the gap 21 is created in the middle portion when the electrical passage 2 is formed. As a result, the degree of freedom is given to the movement of the conductive layer 2, and the contact point can be more freely extended and contracted. The aforementioned effect can be provided in the same manner when the cavity (the region into which the conductive material is not charged) 22 is formed in the middle portion of the through-hole. Although not shown in the drawing, when minute spaces are dispersed inside the conductive passage, the elasticity of the conductive passage can be improved, and the same effect can be provided.

The anisotropic conductive sheet of the present invention can be advantageously used as an electrical energizing means in various apparatus. For example, as explained below in detail, the anisotropic conductive sheet of the present invention can be advantageously used for the electrical connection between the circuit devices and as a contactor in the inspection apparatus for operation test of the circuit devices.

Although the anisotropic conductive sheet of the present invention can be produced by various methods, it is advantageous to produce the anisotropic conductive sheet of the present invention as follows. After the through-holes have been formed at predetermined positions in the insulating base material, these through-holes are filled with a silicone or non-silicone matrix material and a conductive passage-forming material containing a conductive filler dispersed in the matrix material, and then the thus filled matrix material and the conductive passage forming material are hardened. Therefore, the thus formed conductive passage can exhibit a predetermined level of conductivity irrespective of the existence of pressure. In other words, the conductive passage which is electrically conductive at all times is formed. In this way, the anisotropic sheet of the present invention can be advantageously produced.

In the method of producing the anisotropic conductive sheet of the present invention, it is preferable that the insulating base material is prepared as sheet-shaped material by forming or laminating the insulating material as explained before. It is preferable that the insulating thermosetting resin, insulating thermo-plastic resin and insulating ceramics are used as the insulating material.

The through-holes can be machined in the insulating base material by various machining methods. For example, it is possible to use the mechanical machining method of mechanical punching or drilling. Alternatively, it is possible to use the method of irradiating high energy such as patterning conducted by laser beam machining. If necessary, it is possible to adopt the method of etching. These methods are well known. Therefore, detailed explanations will be omitted here.

After the necessary number of through-holes having a predetermined size have been formed in the insulating base material, the silicone or non-silicone matrix material and the conductive passage-forming material containing the conductive filler dispersed in the matrix material, preferably the paste material, are charged into the respective through-holes, for example, by an appropriate charging method such as a screen printing method or transfer method. Then, the thus charged material is hardened by means of heating, light irradiation or leaving the material as it is. In this way, the conductive passages, the respective through-holes of which are charged with the conductive elastic material, can be formed.

In the method of producing the anisotropic conductive sheet of the present invention, when it is necessary for an end face of the conductive passage to protrude from the surface of the base material, the surface of the base material may be etched and selectively removed by irradiating laser beams.

According to another method, a protective film is previously formed on the surface of the insulating base material, and the through-holes are fabricated in the presence of the protective film. In this way, the end face of the conductive passage can protrude from the surface of the base material. After a series of processes of hole opening, charging and hardening have been completed and the conductive passages have been formed, and only when the unnecessary protective film is removed by manual operation, cutter or separating solution, is it possible to provide an anisotropic conductive sheet on which the conductive passages having desired protruding portions are formed. The protective film can be made of, for example, a resin material or a resist material.

When consideration is given to simplification of the producing process, reduction of the producing cost and enhancement of the yield, the anisotropic conductive sheet of the present invention can be advantageously produced, for example, by the methods shown in FIGS. 15A to 15E and FIGS. 16A to 16E.

FIGS. 15A to 15E are sectional views successively showing a preferable method of producing the anisotropic conductive sheet of the present invention.

Figure 15A:
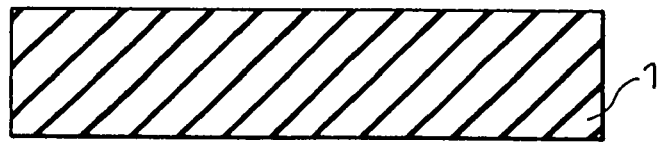
FIGS. 15A to 15E are sectional views successively showing a preferred method of producing a conductive sheet of the present invention.
Figure 15B:
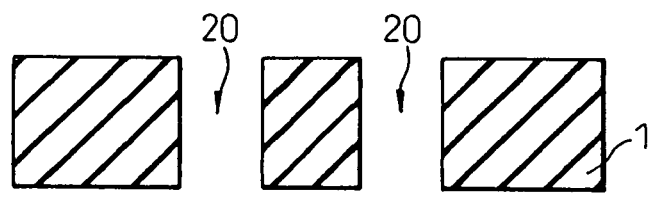

In the process shown in FIG. 15A, the insulating base material 1 of a predetermined thickness is prepared. Then, in the process shown in FIG. 15B, the through-holes 20 are formed at predetermined portions (portions in which the conductive passages are formed) in the base material 1. The through-holes 20 are formed by a machining in which a precision drill is used. Alternatively, the through-holes 20 are precisely formed by laser beam machining.

Figure 15C:
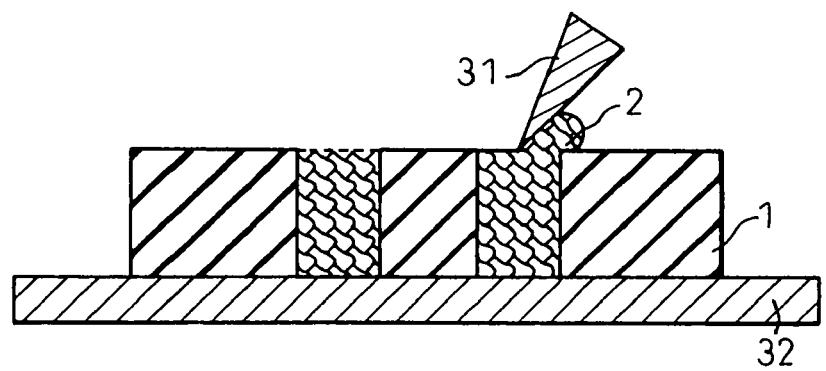

After the through-holes have been formed, as shown in FIG. 15C, the base material 1 is put on the base table 32. Then, paste-like conductive material having rubber elasticity is charged into the through-holes in the base material 1 in the manner similar to screen printing. Redundant paste-like material can be removed, for example, by the squeegee 31.

Figure 15D:
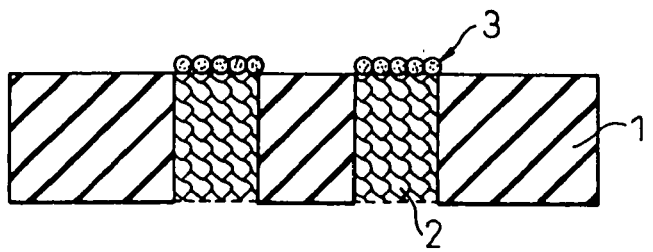

Successively, as shown in FIG. 15D, a selected conductive material is coated on the end faces of the conductive passages 2 so as to form the contact-forming surface layer 3.

After that, in order to form the anisotropic conductive sheet, the conductive passages 2 and the surface layer 2 are hardened. In this case, the hardening condition can be arbitrarily selected according to the composition of the respective layers. For example, in the case where thermo-setting resin is basically used for the conductive passages, it is possible to harden the thermo-setting resin when it is heated to a predetermined temperature. In the case where chemically reactive base material is used for the formation of the conductive passages, it can be hardened to a predetermined hardness when it is left as it is.

Figure 15E:
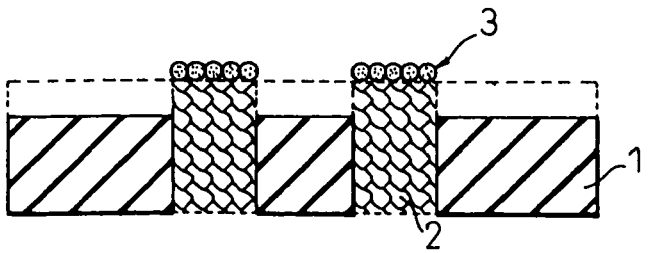

In the case where it is desired that the conductive passages 2 protrude from the surface of the base material 1 on the obtained anisotropic conductive sheet, as shown in FIG. 15E, the base material 1 is cut to a desired depth. When the cutting condition is controlled, the conductive passages 2 can protrude by an arbitrary height. As an appropriate cutting means, it is possible to use laser beam machining because the conductive passages 2 are not affected by laser beam machining. When an output of the laser beam is adjusted, the cutting depth can be easily controlled.

FIGS. 16A to 16E are sectional views successively showing another preferable method of producing the anisotropic conductive sheet of the present invention.

Figure 16A:
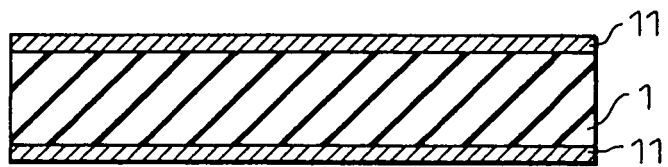
FIGS. 16A to 16E are sectional views successively showing another preferred method of producing a conductive sheet of the present invention.

In the process shown in FIG. 16A, the insulating base material 1 of a predetermined thickness is prepared. On both faces of the base material 1, there are provided protective films 11 which are used as a mask by which the conductive passages can be protruded from the base material 1 in the successive process. For example, the protective films 11 are made of common resin material such as polyester, polypropylene or polystyrene. It is necessary for the protective films 11 to be easily peeled off from the base material 1 in the final peeling process.

Figure 16B:
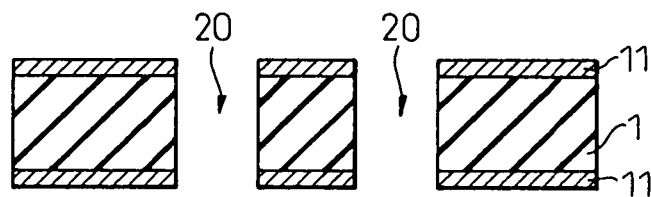

Successively, in the process shown in FIG. 16B, the through-holes 20 are formed at predetermined portions (portions in which the conductive passages are to be formed) in the base material 1. The through-holes 20 are precisely formed by machining in which a precision drill is used or by laser beam machining, for example.

Figure 16C:
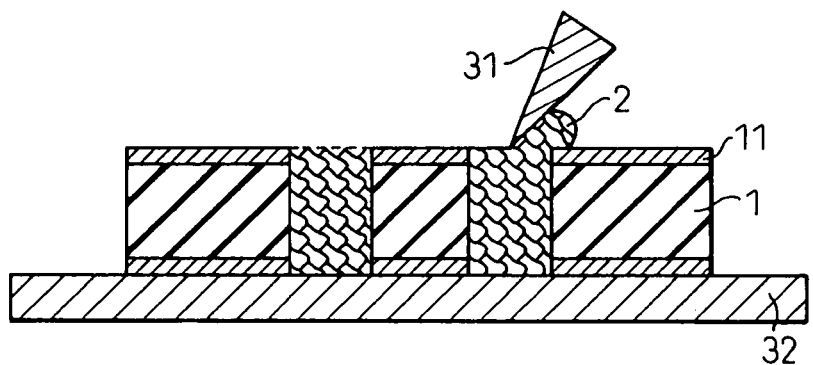

As shown in FIG. 16C, after the through-holes have been formed, the base material 1 is put on the base table 32. Then, paste-like conductive material having rubber elasticity is charged into the through-holes in the base material in the manner similar to screen printing. Redundant paste-like material can be removed, for example, by the squeegee 31.

Figure 16D:
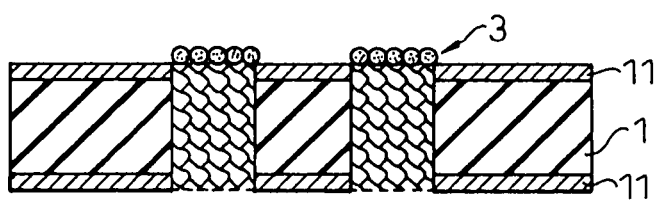

Successively, as shown in FIG. 16D, selected conductive material is coated on the end faces of the conductive passages 2 so as to form the contact-forming conductive material layer 3.

After that, in order to form the anisotropic conductive sheet, the conductive passages 2 and the contact-forming conductive material layer 3 are hardened. In this case, the hardening condition can be arbitrarily selected according to the compositions of the respective layers.

Figure 16E:
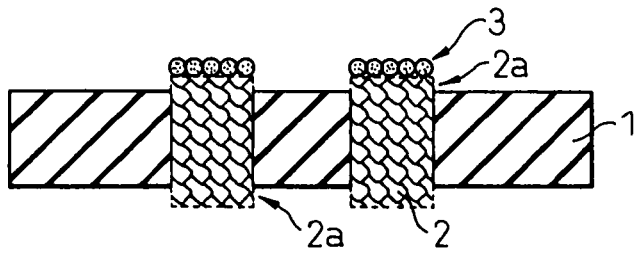

Finally, in order to make the conductive passages 2 protrude from the surface of the base material 1 on the obtained anisotropic conductive sheet, as shown in FIG. 16E, the protective films (not shown), which have been used as a mask, are peeled off from the base material 1 so that it can be removed. Peeling of the protective films may be conducted, for example, by manual operation or with a cutter or an appropriate peeling solution. According to the above method, the conductive passages 2 can protrude by an arbitrary height when the thickness of the protective film is controlled. Therefore, it is unnecessary to use a laser beam machining apparatus, the cost of which is high.

According to the present invention, there is also provided a contact structure comprising a conductive elastic material embedded in the insulating base material, piercing in the thickness direction, characterized in that the conductive elastic material is made of conductive resin-like material capable of exhibiting a predetermined rubber elasticity after it has been hardened and the conductive elastic material can be freely extended and contracted. The aforementioned contact structure is basically the same as the structure around the conductive passages on the anisotropic conductive sheet.

According to the present invention, there is also provided an electronic device in which a plurality of circuit devices are stacked on each other, and the circuit devices are electrically connected with each other via the anisotropic conductive sheet of the present invention.

Figure 17:
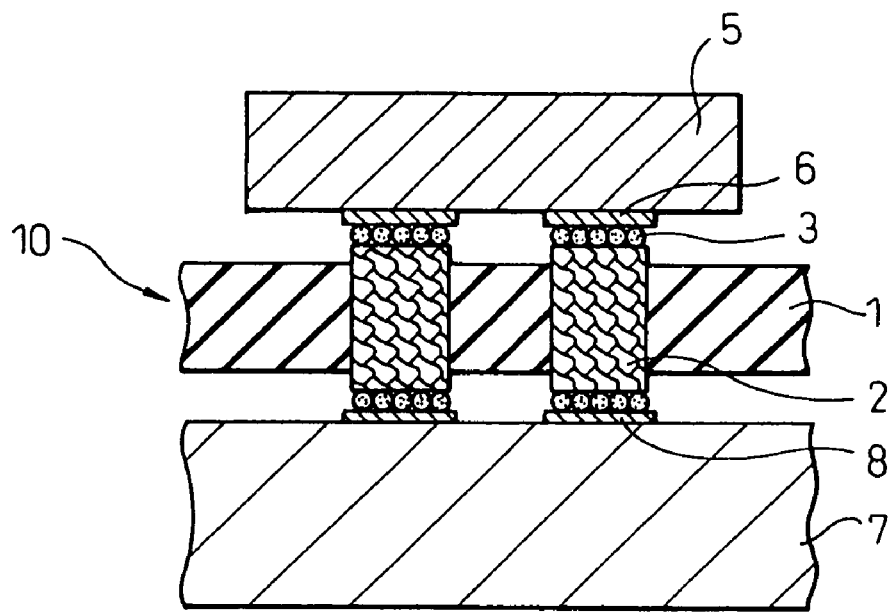
FIG. 17 is a sectional view schematically showing a preferred embodiment of an electronic apparatus into which a conductive sheet of the present invention is incorporated.

The electronic device of the present invention can be composed as schematically shown in FIG. 17. In the electronic device shown in the drawing, the anisotropic conductive sheet 10 of the present invention is used as a contactor for electrically connecting the semiconductor chip (LSI) 5 with the circuit board 7. The anisotropic conductive sheet 10 is the same as that shown in FIG. 9B. In the anisotropic conductive sheet 10, the conductive passages 2 are formed in a portion of the insulating base material 1, and the contact-forming surface layer 3 are provided on the respective end faces of the conductive passages 2. As shown in the drawing, the electrodes 6 of the semiconductor chip 5 and the electrodes 8 of the circuit board 7 are connected with this surface layer 3. The circuit board 7 may be of a simple structure or of a complicated structure such as a built-up wiring board. In this electronic device, no bonding wires are used. Therefore, the device can be made compact without damaging the device.

According to the present invention, there is also provided an inspection apparatus for an operation test used for testing an operation of a circuit device in which one end face of the conductive passage of the anisotropic conductive sheet of the present invention is connected with terminals and others of the circuit device, and the other end face of the conductive passage of the anisotropic conductive sheet is connected with a circuit board and a contacting body to be mounted on the circuit board.

Figure 18:
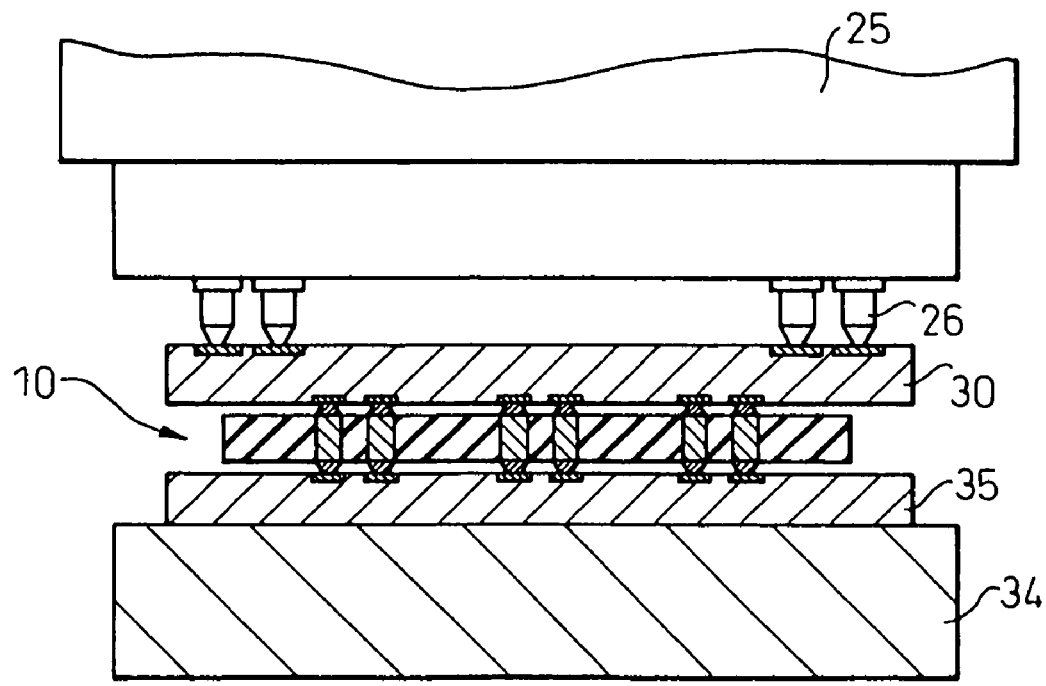
FIG. 18 is a sectional view schematically showing a preferred embodiment of an inspection apparatus for operation test of a circuit device into which a conductive sheet of the present invention is incorporated.

The inspection apparatus of the present invention can be composed as schematically shown in FIG. 18. In the inspection apparatus, in order to test an operation of the circuit board 30 on the evaluation board 35 which has been set on the table 34, the anisotropic conductive sheet 10 is used. That is, an end face (contacts) of the anisotropic conductive sheet is made to come into contact with the electrodes of the evaluation board 35 and the electrodes of the circuit board 30 so that these three members can be electrically connected. Then, end portions of the probes 26 of the tester 25 is pressed against the electrodes of the circuit board 30 so as to conduct testing. Although a strong force is applied to the anisotropic conductive sheet 10, no damage or trouble is caused, and the operation test can be smoothly executed.

EXAMPLES

Successively, examples of the present invention will be explained below. In this connection, it should be noted that the present invention is not limited to the following specific examples.

Example 1

In this example, an anisotropic conductive sheet was produced by the method explained above referring to FIGS. 15A to 15E.

As an insulating base material, there was prepared a polyether etherketone film, the thickness of which is 300 μm. At predetermined positions in this base material, through-holes, the diameters of which are 0.2 mm, were formed with a precision drill. Next, a conductive adhesive, which exhibits rubber elasticity after it has been hardened, was charged into the respective through-holes with a spatula in the manner similar to screen printing. (The conductive adhesive used herein was a material the matrix of which is urethane, the hardness of which is substantially identical with 6B of pencil hardness, and which is available as the item number "3302F" from Three Bond Corporation). Immediately after charging, metal covered powders as a contact-forming conductive material were coated on the conductive adhesive layer and heated at 120° C. in an oven for one hour so as to harden the conductive adhesive. (The metal covered powders are available under the trade name "Bride GNR-EH" from Nippon Kagaku Kogyo Corporation.)

Successively, an exposed surface of the base material was cut at the depth of about 50 μm by eximer laser beams while the intensity of irradiation was being appropriately adjusted. In this way, an anisotropic conductive sheet, the conductive passages of which protruded, was obtained.

Example 2

In this example, an anisotropic conductive sheet was produced by the method explained above referring to FIGS. 16A to 16E.

An insulating base material was made in such a manner that PET films of 100 μm thickness were bonded onto both faces of a polyether etherketone film of 300 μm thickness with a simple peeling adhesive. Through-holes of 0.2 mm diameter were formed at predetermined positions of this base material with a precision drill. Next, a conductive adhesive, which exhibits rubber elasticity after it has been hardened, was charged into the respective through-holes with a spatula in the manner similar to screen printing. (The conductive adhesive used herein was a material the matrix of which is urethane, the hardness of which is substantially identical with 6B of pencil hardness, and which is available as the item number "3303E" from Three Bond Corporation.) Immediately after charging, metal covered powders as contact-forming conductive material were coated on the conductive adhesive layer and heated at 120° C. in an oven for one hour so as to harden the conductive adhesive. (The metal covered powders are available under the trade name "Bride GNR-EH" from Nippon Kagaku Kogyo Corporation.)

Successively, the PET films, which were bonded onto the base material as protective films, were strongly pulled and peeled off. In this way, an anisotropic conductive sheet, the conductive passages of which protruded, was obtained.

As explained above, according to the present invention, by a simple production process, it becomes possible to produce a contact, which can be freely extended and contracted so that the contacting property is enhanced high, a contact structure (contactor) in which the contact is embedded so that the contact can pierce a film, and an anisotropic conductive sheet.

Since this anisotropic conductive sheet can be produced by the simplified production process, it can be produced by a low cost.

Further, this anisotropic conductive sheet is advantageous, because the life span is long the anisotropic conductive sheet can be applied to a structure in which the pitch is small a predetermined electrical connection can be attained and the circuit device is not polluted.

Further, the contactor of the present invention is advantageous, because the contactor is capable of coming into contact with terminals of all LSIs on a wafer as produced.

According to the present invention, in addition to the contactor and the anisotropic conductive sheet, it becomes also possible to provide an electronic device and inspection apparatus used for an operation test of high performance because of incorporation of the anisotropic conductive sheet of the present invention.

Especially, if the surface of the conductive passage portion, which is made of base material resin such as urethane resin or silicon resin, is densely covered with metallic rods or metallic balls, the influence of out-gas generated by the decomposition of resin can be suppressed, and the peeling of a film and the occurrence of pollution caused on the surface of an object to be inspected can be prevented.

What is claimed is:

1. An anisotropic conductive sheet, forming an electrical connection of electronic parts, comprising an insulating base material and a plurality of conductive passages embedded at predetermined positions in the insulating base material, penetrating the insulating base material in the thickness direction, wherein the insulating base material is a sheet-shaped material consisting of an insulating material selected from an insulating thermosetting resin, an insulating thermoplastic resin and an insulating ceramic material, the conductive passage comprises a matrix consisting of non-silicone material having rubber elasticity, the non-silicone material being filled into through-holes formed at a predetermined position in the base material, and a conductive filler dispersed in the matrix at an amount being hardened and retaining conductivity, the conductive filler being in a form of powder-shaped, bead-shaped, flake-shaped, needle-shaped or branch-shaped fine particles, wherein the non-silicone material filling the matrix and the conductive filler in the matrix are hardened and maintain a predetermined level of conductivity, and the conductive passages are formed at a pitch of less than 150 µm, and a surface layer made of conductive material capable of functioning as a contact is further provided on at least one of the end faces of the conductive passage, the surface layer is made of metal selected from the group consisting of gold, silver, copper, nickel and aluminum or an alloy of such metal, the surface layer comprises fine particles, the shape of which is broken-piece-shaped, bead-shaped, rod-shaped or lump-shaped, and the surface layer is constituted from the fine particles or an aggregated body of the same.

2. An anisotropic conductive sheet according to claim 1, wherein the non-silicone material is one member selected from the group consisting of natural rubber, styrene butadiene rubber, nitrile butadiene rubber, ethylene propylene rubber, chloroprene rubber, hydrine rubber, acrylic rubber, urethane rubber, as well as resins and adhesives corresponding to the above rubbers.

3. An anisotropic conductive sheet according to claim 1, wherein the filler is fine conductive particles selected from the group consisting of gold, silver, copper, nickel, aluminum, and their alloy, carbon black and graphite.

4. An anisotropic conductive sheet according to claim 1, wherein the filler is composed of fine conductive particles which comprise a core particle and conductive metal covering a surface of the core particle.

5. An anisotropic conductive sheet according to claim 1, wherein the sheet-shaped material is formed upon molding and/or lamination of the insulating material.

6. An anisotropic conductive sheet according to claim 1, wherein the length of the conductive passage is identical with or larger than the thickness of the base material.

7. An anisotropic conductive sheet according to claim 1, wherein a surface layer made of conductive material, which is capable of functioning as a contact and ensuring an electrical connection by piercing a surface layer of an opponent when the surface layer is used as a contact, is further provided on at least one of the end faces of the conductive passage.

8. An anisotropic conductive sheet according to claim 7, wherein the surface layer is made of metal selected from the group consisting of gold, silver, copper, nickel and aluminum or an alloy of such metal, the surface layer comprises fine particles, the shape of which is broken-piece-shaped, bead-shaped, rod-shaped or lump-shaped, and the surface layer is constituted from these fine particles or an aggregated body of the same.

9. An anisotropic conductive sheet according to claim 8, wherein at least one portion of the surface of the fine particles is coated with a thin metallic film.

10. An anisotropic conductive sheet according to claim 8, wherein a surface of the fine particles partially has very minute protrusions, the shapes of which are regular or irregular.

11. An anisotropic conductive sheet according to claim 1, wherein the anisotropic conductive sheet is used as a contactor for electrically connecting circuit devices.

12. An anisotropic conductive sheet according to claim 1, wherein the anisotropic conductive sheet is used as a contactor in an inspection apparatus for inspecting circuit devices.

13. An anisotropic conductive contact structure sheet in which a plurality of conductive passages are embedded in an insulating base material, the conductive passages being penetrated in the thickness direction of the insulating base material, wherein the insulating base material is a sheet-shaped material consisting of an insulating material selected from an insulating thermosetting resin, an insulating thermoplastic resin and an insulating ceramic material, the conductive passage comprises a matrix consisting of non-silicone material having a predetermined rubber elasticity, the non-silicone material being filled into through-holes formed at a predetermined position in the base material, and a conductive filler dispersed in the matrix at an amount being hardened and retaining conductivity, and the conductive passage can be freely extended and contracted in the thickness direction of the base material, the conductive filler being in a form of powder-shaped, bead-shaped, flake-shaped, needle-shaped or branch-shaped fine particles, wherein the non-silicone material filling the matrix and the conductive filler in the matrix are hardened and maintain a predetermined level of conductivity, and the conductive passage is formed at a pitch of less than 150 µm, and a surface layer made of conductive material capable of functioning as a contact is further provided on at least one of the end faces of the conductive passage, the surface layer is made of metal selected from the group consisting of gold, silver, copper, nickel and aluminum or an alloy of such metal, the surface layer comprises fine particles, the shape of which is broken-piece-shaped, bead-shaped, rod-shaped or lump-shaped, and the surface layer is constituted from the fine particles or an aggregated body of the same.

14. An anisotropic conductive sheet, forming an electrical connection of electronic parts, comprising an insulating base material and a plurality of conductive passages embedded at predetermined positions in the insulating base material, penetrating the insulating base material in the thickness direction, wherein the length of the conductive passage is identical with the thickness of the base material, the insulating base material is a sheet-shaped material consisting of an insulating material selected from an insulating thermosetting resin, an insulating thermoplastic resin and an insulating ceramic material, the conductive passage comprises a matrix consisting of silicone material having rubber elasticity, the silicone material being filled into through-holes formed at a predetermined position in the base material, and a conductive filler dispersed in the matrix at an amount capable of being hardened and retaining conductivity, the conductive filler being in a form of powder-shaped, bead-shaped, flake-shaped, needle-shaped or branch-shaped fine particles, wherein the silicone material filling the matrix and the conductive filler in the matrix are hardened and maintain a predetermined level of conductivity, and the conductive passage is formed at a pitch of less than 150 μm, and a surface layer made of conductive material capable of functioning as a contact is further provided on at least one of the end faces of the conductive passage, the surface layer is made of metal selected from the group consisting of gold, silver, copper, nickel and aluminum or an alloy of such metal, the surface layer comprises fine articles, the shape of which is broken-piece-shaped, bead-shaped, rod-shaped or lump-shaped, and the surface layer is constituted from the fine particles or an aggregated body of the same.

15. An anisotropic conductive contact structure sheet in which a plurality of conductive passages are embedded in an insulating base material, the conductive passages being penetrated in the thickness direction of the insulating base material, wherein the length of the conductive passage is identical with the thickness of the base material, the insulating base material is a sheet-shaped material consisting of an insulating material selected from an insulating thermosetting resin, an insulating thermoplastic resin and an insulating ceramic material, the conductive passage comprises a matrix consisting of silicone material having rubber elasticity, the silicone material being filled into through-holes in the base material, and a conductive filler dispersed in the matrix at an amount capable of being hardened and retaining conductivity, and the conductive passage can be freely extended and contracted in the thickness direction of the base material, the conductive filler being in a form of powder-shaped, bead-shaped, flake-shaped, needle-shaped or branch-shaped fine particles, wherein the silicone material filling the matrix and the conductive filler in the matrix are hardened and maintain a predetermined level of conductivity, and the conductive passage is formed at a pitch of less than 150 μm, and a surface layer made of conductive material capable of functioning as a contact is further provided on at least one of the end faces of the conductive passage, the surface layer is made of metal selected from the group consisting of gold, silver, copper, nickel and aluminum or an alloy of such metal, the surface layer comprises fine particles, the shape of which is broken-piece-shaped, bead-shaped, rod-shaped or lump-shaped, and the surface layer is constituted from the fine particles or an aggregated body of the same.

16. An anisotropic conductive sheet, forming an electrical connection of electronic parts, comprising an insulating base material and a plurality of conductive passages embedded at predetermined positions in the insulating base material, penetrating the insulating base material in the thickness direction, wherein the insulating base material is a sheet-shaped material consisting of an insulating material selected from an insulating thermosetting resin, an insulating thermoplastic resin and an insulating ceramic material, the conductive passage comprises a matrix consisting of silicone material having rubber elasticity, the silicone material being filled into through-holes formed in the base material, and a conductive filler dispersed in the matrix at an amount capable of being hardened and retaining pressure-independent conductivity, the conductive filler being in a form of powder-shaped, bead-shaped, flake-shaped, needle-shaped or branch-shaped fine particles, and said conductive sheet further comprises a conductive surface layer, which functions as a contact and ensures a sufficient electrical connection by piercing a surface layer of an opponent terminal when the conductive surface layer is used as a contact, wherein the silicone material filling the matrix and the conductive filler in the matrix are hardened and maintain a predetermined level of conductivity, and the conductive passage is formed at a pitch of less than 150 μm, the surface layer is made of metal selected from the group consisting of gold, silver, cooper, nickel and aluminum or an alloy of such metal, the surface layer comprises fine particles, the shape of which is broken-piece-shaped, bead-shaped, rod-shaped or lump-shaped, and the surface layer is constituted from the fine particles or an aggregated body of the same.

17. An anisotropic conductive sheet according to claim 16, wherein the length of the conductive passage is identical with or larger than the thickness of the base material.

18. An anisotropic conductive contact structure sheet in which a plurality of conductive passages are embedded in an insulating base material, the conductive passage being penetrated in the thickness direction of the insulating base material, wherein the insulating base material is a sheet-shaped material consisting of an insulating material selected from an insulating thermosetting resin, an insulating thermoplastic resin and an insulating ceramic material, the conductive passage comprises a matrix consisting of silicone material having rubber elasticity, the silicone material being filled into through-holes in the base material, and a conductive filler dispersed in the matrix at an amount capable of being hardened and retaining conductivity, the conductive filler being in a form of powder-shaped bead-shaped, flake-shaped, needle-shaped or branch-shaped fine particles, the conductive passage further comprises a conductive surface layer, which functions as a contact and ensures a sufficient electrical connection by piercing a surface layer of an opponent terminal when the conductive surface layer is used as a contact, on at least one of the end faces of the conductive passage, and the conductive passage can be freely extended and contracted in the thickness direction of the base material, wherein the silicone material filling the matrix and the conductive filler in the matrix are hardened and maintain a predetermined level of conductivity, and the conductive passage is formed at a pitch of less than 150 μm, the surface layer is made of metal selected from the group consisting of gold, silver, copper, nickel and aluminum or an alloy of such metal, the surface layer comprises fine particles, the shape of which is broken-piece-shaped, bead-shaped, rod-shaped, or lump-shaped, and the surface layer is constituted from the fine particles or an aggregated body of the same.

19. An inspection apparatus for an operation test used for testing an operation of a circuit device, which comprises an anisotropic conductive sheet comprising an insulating base material and a plurality of conductive passages embedded at predetermined positions in the insulating base material, penetrating the insulating base material in the thickness direction, the insulating base material being a sheet-shaped material consisting of an insulating material selected from an insulating thermosetting resin, an insulating thermoplastic resin and an insulating ceramic material, the conductive passage comprising a matrix consisting of silicone material having rubber elasticity, the silicone material being filled into through-holes formed in the base material, and a conductive filler dispersed in the matrix at an amount capable of being hardened and retaining conductivity, the conductive filler being in a form of powder-shaped, bead-shaped, flake-shaped, needle-shaped or branch-shaped fine particles, and in which the anisotropic conductive sheet further comprises on at least one of the end faces of the conductive passage a conductive surface layer, which functions as a contact and ensures a sufficient electrical connection by piercing a surface layer of an opponent terminal when the conductive surface layer is used as a contact, wherein one end face of the conductive passage of the anisotropic conductive sheet is connected with terminals of the circuit device, and the other end face of the conductive passage of the anisotropic conductive sheet is connected with a circuit board and a contacting body to be mounted on the circuit board, wherein the silicone material filling the matrix and the conductive filler in the matrix are hardened and maintain a predetermined level of conductivity, and the conductive passage is formed at a pitch of less than 150 μm, the surface layer is made of metal selected from the group consisting of gold, silver, copper, nickel and aluminum or an alloy of such metal, the surface layer comprises fine particles, the shape of which is broken-piece-shaped, bead-shaped, rod-shaped or lump-shaped, and the surface layer is constituted from the fine particles or an aggregated body of the same.

20. An anisotropic conductive sheet, forming an electrical connection of electronic parts, comprising an insulating base material having a plurality of conductive passages embedded therein in a thickness direction, the insulating base material being a sheet-shaped material consisting of an insulating material selected from an insulating thermosetting resin, an insulating thermoplastic resin and an insulating ceramic material, the passages comprising a hardened conductive matrix of elastic non-silicone material and conductive filler, the conductive filler being in a form of powder-shaped, bead-shaped, flake-shaped, needle-shaped or branch-shaped fine particles, wherein the non-silicone material filling the matrix and the conductive filler in the matrix are hardened and maintain a predetermined level of conductivity, and the conductive passage is formed at a pitch of less than 150 μm, and a surface layer made of conductive material capable of functioning as a contact is further provided on at least one of the end faces of the conductive passage, the surface layer is made of metal selected from the group consisting of gold, silver, copper, nickel and aluminum or an alloy of such metal, the surface layer comprises fine particles, the shape of which is broken-piece-shaped, bead-shaped, rod-shaped or lump-shaped, and the surface layer is constituted from the fine particles or an aggregated body of the same.

\* \* \* \* \*

UNITED STATES PATENT AND TRADEMARK OFFICE
CERTIFICATE OF CORRECTION

PATENT NO. : 7,267,559 B2
APPLICATION NO. : 10/141778
DATED : September 11, 2007
INVENTOR(S) : Takafumi Hashitani et al.

It is certified that error appears in the above-identified patent and that said Letters Patent is hereby corrected as shown below:

Column 22, Line 27, change "cooper" to --copper--.

Column 22, Line 48, change "powder-shaped" to --powder-shaped,--.

Signed and Sealed this

Fifteenth Day of April, 2008

JON W. DUDAS
*Director of the United States Patent and Trademark Office*